(12) United States Patent
Harrison et al.

(10) Patent No.: US 6,523,253 B1
(45) Date of Patent: *Feb. 25, 2003

(54) Z-AXIS PROCESSOR POWER DELIVERY SYSTEM

(75) Inventors: Joe A. Harrison, Olympia, WA (US); Edward R. Stanford, Dupont, WA (US)

(73) Assignee: Intel Corporation, Santa Clara, CA (US)

(*) Notice: Subject to any disclaimer, the term of this patent is extended or adjusted under 35 U.S.C. 154(b) by 362 days.

This patent is subject to a terminal disclaimer.

(21) Appl. No.: 09/583,927

(22) Filed: May 31, 2000

(51) Int. Cl.[7] .................................................. H05K 3/30
(52) U.S. Cl. .............................. 29/832; 29/834; 29/836; 29/854

(58) Field of Search ........................... 29/832, 834, 836, 29/854

(56) References Cited

U.S. PATENT DOCUMENTS 6,360,431 B1 * 3/2002 Harrison et al. .............. 29/825

* cited by examiner

*Primary Examiner*—Joseph J. Hail, III
*Assistant Examiner*—Alvin J Grant
(74) *Attorney, Agent, or Firm*—Trop, Pruner & Hu, P.C.

(57) ABSTRACT

A system for delivering power to a processor enables a DC-to-DC converter substrate to be secured to the processor carrier in the Z-axis direction. The ability to assemble the converter to the processor in this way facilitates assembly compared to systems in which the converter is plugged in to the processor carrier in the direction substantially parallel to the surface of the motherboard.

16 Claims, 2 Drawing Sheets

Z-AXIS PROCESSOR POWER DELIVERY SYSTEM

BACKGROUND

This invention relates generally to power delivery to electronic circuits and particularly to an improved power delivery system for supplying power from a power source to a processor.

In a typical computer system, a large printed circuit known as a "motherboard" contains a number of basic components. The motherboard is supplied with voltage from a power supply. The motherboard includes connectors for daughter boards that can be plugged in to provide additional capabilities. Such boards, for example, may provide an interface to disk drives and compact disk read only memories, and may provide modem interfaces for local area networks and the like.

Processors operate at lower voltages than some other components on the motherboard. However, because of their high speed, processors consume large amounts of power despite the fact that they use lower voltages. Since the processor is operating at a low voltage with high power, the current required by the processor is large. A localized DC-to-DC converter (known as a voltage regulator module (VRM) or power pod) reduces the main supply voltage for supplying the processor, for example. Typically for Intel 32 bit processors, this DC-to-DC converter plugs into a connector on the motherboard. The lower voltage is then conducted through printed circuit traces on the motherboard to the processor socket. For higher current Intel 64 bit processors, the DC-to-DC converter connects directly to the processor package through an edge connector because of the high loss associated with conveying power through two connectors and the motherboard as in Intel 32-bit systems. The power connector may also provide signal connections related to power supply issues.

Conventionally, the processor is plugged into the motherboard in a direction that is transverse to the plane of the motherboard. If the plane of the motherboard defines the X and Y directions, the processor is plugged into the motherboard in the Z-axis direction. In other words, the processor is moved from a position above the motherboard downwardly to plug into the motherboard. Conventionally, the DC-to-DC converter is plugged onto the processor package edge in a direction that is generally parallel to the surface of the motherboard (transverse to the Z-axis direction).

This configuration results in a number of difficulties. With the processor already attached to the motherboard, the action of plugging the converter into the processor carrier along the surface of the motherboard (e.g., the X-axis direction) is prone to interference from upwardly directed components already on the motherboard. Moreover, there is little room to manipulate the converter connections along the motherboard. The interconnection of the converter and the processor carrier is awkward, increasing the demands on assembly workers and requiring more elaborate interconnection devices. A complex rigid mount mechanism is used to align the processor package and the DC-to-DC converter in both the Z and X axes. This takes up a large amount of motherboard real estate.

Thus, there is a need for an improved way of delivering power to a processor package edge.

DETAILED DESCRIPTION

Figure 1:
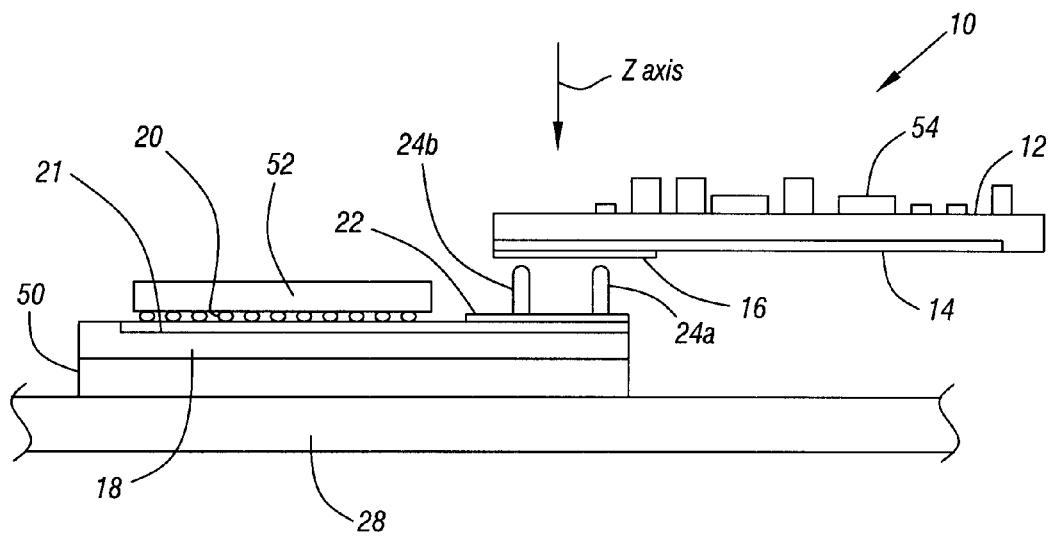
FIG. 1 is a side elevational view of one embodiment of the invention in the course of assembly.

Referring to FIG. 1, a processor power delivery system 10 enables a DC-to-DC converter 12 to be assembled to a processor carrier 18 in the Z-axis. The Z-axis (indicated by an arrow in FIG. 1) is the direction that is transverse to the surface of a motherboard 28 and transverse to the lengths of the converter 12 and the processor carrier 18.

The processor carrier 18 may be plugged into a socket 50 that in turn plugs into a motherboard 28, all in the Z-axis direction. A processor 52 may be attached on the carrier 18, for example using surface mount solder balls 20, to a connection layer 21. Thereafter, the converter 12, including components 54, may plugged atop the processor carrier 18 also in the Z-axis direction. This greatly facilitates the connection of the two units.

The converter 12 includes contacts 16 on its lower surface 14 to make direct surface to surface contact with the processor carrier 18. The contacts 16 communicate with the converter 12 components 54 through vias (not shown). The processor carrier 18 includes contacts 22 on its upper surface that mate with the contacts 16 when the carrier 18 and converter 12 are edge combined. The contacts 22 eventually electrically connect to power supply pins (not shown) on the processor 52 through connection layer 21. In one embodiment, the contacts 16 and 22 may each be formed of a copper land pattern.

A pair of upstanding alignment pins 24a and 24b on the processor carrier 18 pass through holes (not shown in FIG. 1) in the converter 12. This pin/hole connection aligns the contacts 16 and 22 and facilitates the clamping engagement between the converter 12 and the processor carrier 18.

Figure 2:
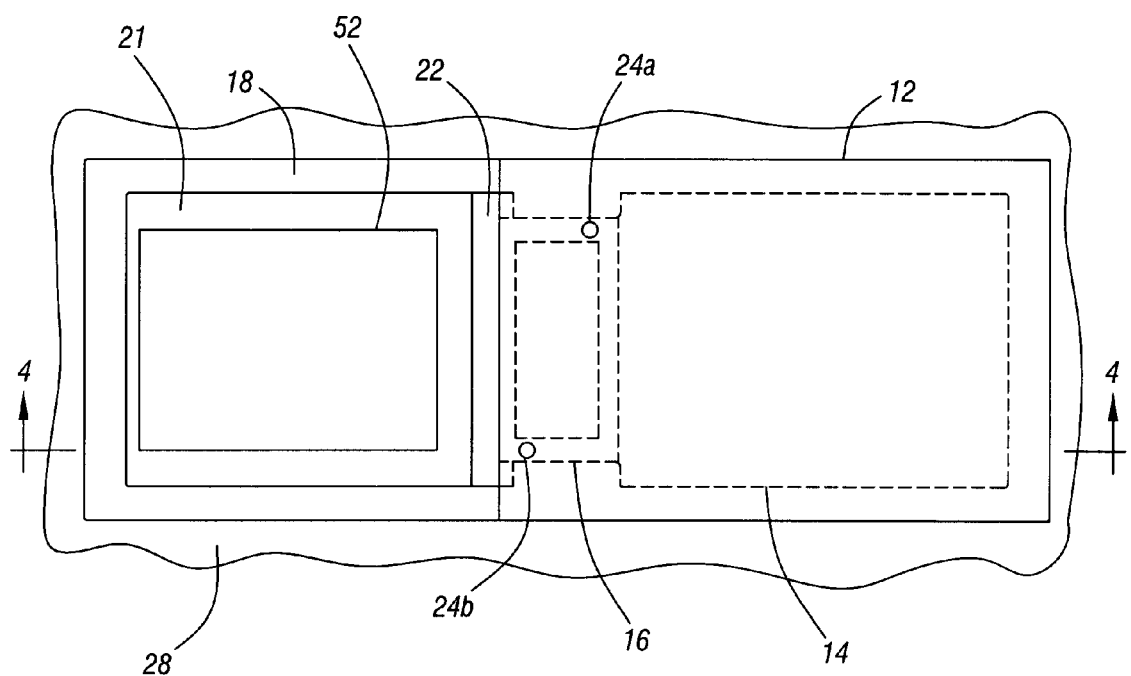
FIG. 2 is a top plan view of the embodiment shown in FIG. 1.

Thus, referring to FIG. 2, the pins 24a and 24b pass completely through the converter 12 in one embodiment of the present invention. This engagement aligns the contacts 16 and 22 with respect to one another as the converter 12 is pressed down into firm engagement with the processor carrier 18 in the Z-axis direction.

Figure 4:
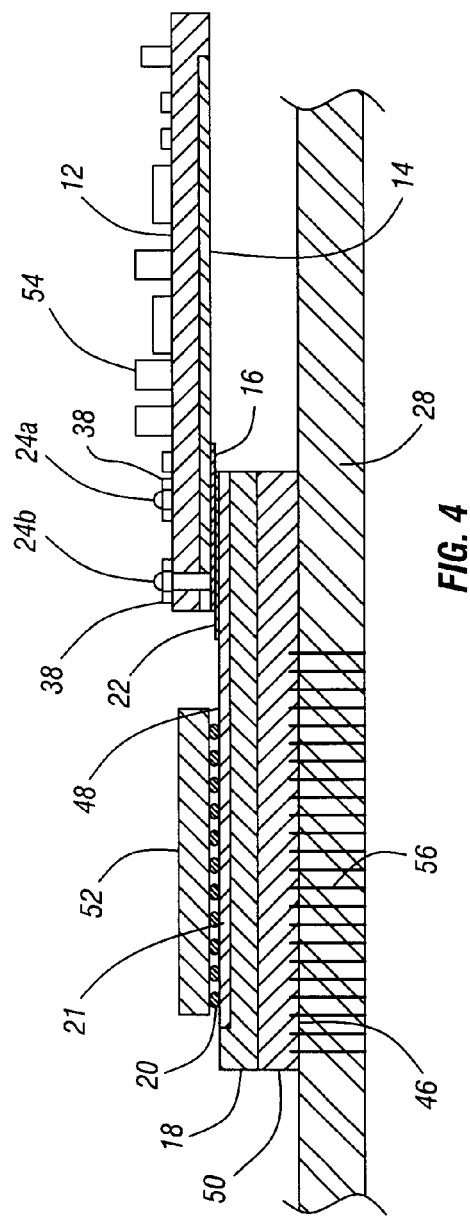
FIG. 4 is a cross-sectional view taken generally along the line 4—4 in FIG. 2.

Referring to FIG. 4, the converter 12 laps over an edge and electrically engages, in direct surface to surface contact, the processor carrier 18. The converter 12 and processor carrier 18 may be clamped together using clamping devices 38. In one embodiment of the present invention, the pins 24 may be threaded and may be secured using threaded fasteners. However, other clamping devices may be utilized to maintain an even clamping force along the length of the contacts 16 and 22.

Figure 3:
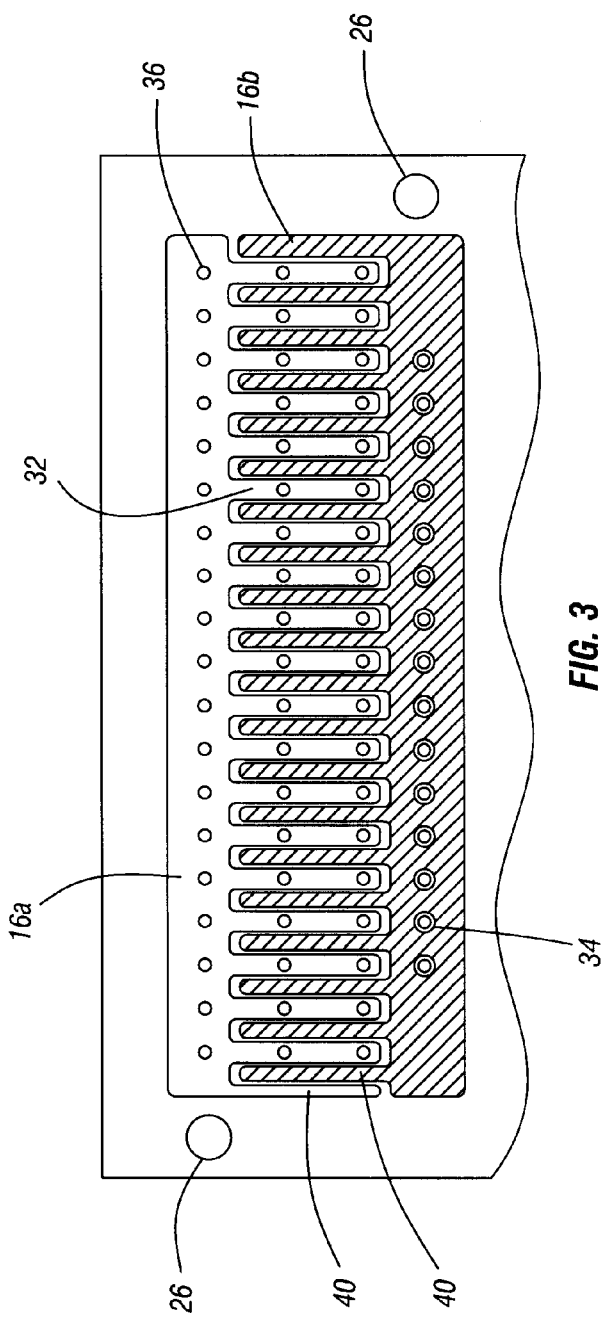
FIG. 3 is an enlarged, partial, bottom plan view of the DC-to-DC converter substrate planar power contacts shown in FIG. 1.

Referring to FIG. 3, the contacts 16 of the converter 12 include a first set of planar interdigitated contacts 16a that may provide a power supply (Vcc) connection. A second set of planar interdigitated contacts 16b may provide the ground (Vss) or return power connection. The interdigitation may be achieved through fingers 40, in one embodiment of the present invention. The interdigitation of the fingers 40 reduces the inductance of the power contacts 16a and the ground contacts 16b since mutual inductance is cancelled out by the interdigitated arrangement.

Power control signals (such as a PWRGOOD signal) may also pass through the contacts 16 from the contacts 22. For example, a plurality of isolated power signal vias 34 may extend through the contacts 16. Similarly, vias 36 may pass through the process planar power contacts 22. The arrangement of the signal vias 34 and 36 is subject to considerable variation.

Alignment holes 26 are provided on the converter 12 for engagement with the alignment pins 24 on the processor carrier 18. The arrangement of the contacts 22 may be identical to that shown in FIG. 3 with the exception that the contacts 22 may include vias 36 to an internal copper land pattern (not shown) and may further include the vias 34 which extend through the contacts 16 for conduction of other signals.

In this way, the contacts 16 and 22 may be brought into direct, planar surface to surface contact with one another. The contacts 16 and 22 may be brought into direct engagement in the Z-axis direction, with the converter 12 atop the processor carrier 18. With the application of a compression force across the converter 12 and the processor carrier 18, good electrical contact may be obtained. The pins 56 on the socket 50 provide electrical communication with the motherboard 28.

Because the converter 12 and the processor carrier 18 may both be assembled in the Z-axis direction, the assembly of the processor power delivery system 10 is facilitated. Of course, it is not necessary that either the converter 12 or the processor carrier 18 be rigorously moved through the Z-axis direction. Instead, either or both of the converter 12 and the processor carrier 18 may be moved so as to have a component of displacement in the Z-axis direction relative to the plane of the motherboard 28. Since the contacts 16 and 22 meet along a common plane, the converter 12 may be moved onto the processor carrier 18 at any angle between the Z-axis and the plane of the motherboard 28.

The electrical performance may be optimized in some embodiments by modifying the patterning of the contacts 16 and 22 without re-tooling converter 12 or carrier 18 assemblies. Some embodiments may achieve a mechanical benefit from having a single axis of assembly.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   attaching a processor carrier to a motherboard by moving said processor carrier onto said motherboard in a direction having a component transverse to the surface of said motherboard; and
   securing a DC-to-DC converter to the processor carrier in a direction having a component transverse to the surface of said motherboard.

2. The method of claim 1 further including aligning said processor carrier and said converter using at least two alignment pins.

3. The method of claim 1 including providing substantially planar power and ground contacts on each one of said processor carrier and said converter.

4. The method of claim 3 including providing interdigitated power and ground contacts on each one of said processor carrier and said converter.

5. The method of claim 3 including arranging said substantially planar power and ground contacts substantially parallel to the surface of said motherboard.

6. The method of claim 3 including causing the power signal pins to pass through said substantially planar contacts.

7. The method of claim 1 including securing said substrate to said processor carrier in substantially the same direction that said processor carrier was attached to the motherboard.

8. The method of claim 1 including securely clamping said converter onto said processor carrier.

9. The method of claim 1 including causing said converter to lap said processor carrier.

10. The method of claim 1 including securing said processor carrier to said motherboard before securing said converter to said carrier.

11. A method comprising:
    plugging a DC-to-DC converter on top of a processor carrier in turn secured to a motherboard; and
    providing substantially planar power and ground contacts on said converter and said processor carrier; and
    engaging said contacts on said converter with said contacts on said carrier such that said contacts are substantially parallel to said motherboard.

12. The method of claim 11 including clamping said converter onto said processor carrier.

13. The method of claim 11 including forming power and ground regions of the contacts of said processor carrier and said converter and interdigitating said power and ground regions.

14. The method of claim 11 including plugging said converter into said processor carrier.

15. The method of claim 14 including aligning said converter with said processor carrier using alignment pins on one of said processor carrier and converter.

16. The method of claim 11 including securing said processor carrier to said motherboard in the same direction said converter is secured onto said processor carrier.

* * * * *